United States Patent
Koch et al.

(10) Patent No.: US 11,329,236 B2
(45) Date of Patent: *May 10, 2022

(54) BAND EDGE EMISSION ENHANCED ORGANIC LIGHT EMITTING DIODE UTILIZING CHIRAL LIQUID CRYSTALLINE EMITTER

(71) Applicant: RED BANK TECHNOLOGIES LLC, Red Bank, NJ (US)

(72) Inventors: Gene C. Koch, Toms River, NJ (US); John N. Magno, St. James, NY (US)

(73) Assignee: RED BANK TECHNOLOGIES LLC, Red Bank, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/907,478

(22) Filed: Jun. 22, 2020

(65) Prior Publication Data

US 2021/0013429 A1    Jan. 14, 2021

Related U.S. Application Data

(63) Continuation of application No. 15/999,863, filed as application No. PCT/US2017/021867 on Mar. 10, 2017, now Pat. No. 10,727,421.
(Continued)

(51) Int. Cl.
*H01L 51/00* (2006.01)
*H01L 51/50* (2006.01)
(Continued)

(52) U.S. Cl.
CPC ...... *H01L 51/0076* (2013.01); *C09K 19/3477* (2013.01); *C09K 19/3491* (2013.01);
(Continued)

(58) Field of Classification Search
CPC . H01L 51/0076; H01L 51/5237; H01L 51/56; H01L 51/5012; H01L 51/5275;
(Continued)

(56) References Cited

U.S. PATENT DOCUMENTS 4,949,350 A    8/1990  Jewell et al.
5,450,220 A *  9/1995  Onishi ................. C09K 19/544
                                              349/89
(Continued)

FOREIGN PATENT DOCUMENTS

DE    19809944      10/1998
WO    2006058182    6/2006

OTHER PUBLICATIONS

International Search Report and Written Opinion of corresponding International Application No. PCT/US17/21867 dated Jul. 7, 2017.
(Continued)

*Primary Examiner* — Ahmed N Sefer
(74) *Attorney, Agent, or Firm* — Reed Smith LLP

(57) ABSTRACT

Disclosed herein is a light emitting device and method of manufacturing such a device comprised of a series of photopolymerizable, chiral liquid crystalline layers that can be solvent cast on a substrate. The mixture of chiral materials in each successive layer may be blended in such a way that each layer has the same chiral pitch. Further the chiral materials in each layer may also be blended so that the ordinary and extraordinary refractive indices in each layer match the other layers such that the complete assembly of layers will optically function as a single relatively thick layer of chiral liquid crystal. The chiral nematic material in each layer can spontaneously adopt a helical structure with a helical pitch. The light emitting layers of the light emitting
(Continued)

device can further comprise electroluminescent material that emits light into the band edge light propagation modes of the photonic crystal.

20 Claims, 19 Drawing Sheets

Related U.S. Application Data

(60) Provisional application No. 62/306,128, filed on Mar. 10, 2016.

(51) Int. Cl.
| | | |
|---|---|---|
| *C09K 19/58* | (2006.01) | |
| *C09K 19/34* | (2006.01) | |
| *C09K 19/38* | (2006.01) | |
| *C09K 19/54* | (2006.01) | |
| *G02F 1/1334* | (2006.01) | |
| *H01L 51/52* | (2006.01) | |
| *H01L 51/56* | (2006.01) | |
| *C09K 19/04* | (2006.01) | |
| *G02F 1/137* | (2006.01) | |

(52) U.S. Cl.
CPC ...... *C09K 19/3857* (2013.01); *C09K 19/3861* (2013.01); *C09K 19/544* (2013.01); *C09K 19/586* (2013.01); *G02F 1/1334* (2013.01); *H01L 51/5012* (2013.01); *H01L 51/5237* (2013.01); *H01L 51/56* (2013.01); *C09K 2019/0437* (2013.01); *C09K 2019/0448* (2013.01); *G02F 1/13756* (2021.01); *H01L 51/0034* (2013.01); *H01L 51/5275* (2013.01)

(58) Field of Classification Search
CPC ............ H01L 51/0034; H01L 51/5076; H01L 51/5056; H01L 51/506; H01L 51/5072; C09K 19/586; C09K 19/3477; C09K 19/3491; C09K 19/3861; C09K 19/3857; C09K 19/544; C09K 2019/0437; C09K 2019/0448; G02F 1/1334; G02F 1/13756; G02F 1/1343; G02F 1/137
See application file for complete search history.

(56) References Cited

U.S. PATENT DOCUMENTS

| | | |
|---|---|---|
| 6,160,828 A | 12/2000 | Kozlov et al. |
| 6,645,579 B1 | 11/2003 | Tsuboyama et al. |
| 7,118,787 B2 | 10/2006 | O'Neill et al. |
| 7,335,921 B2 | 2/2008 | Magno et al. |
| 9,129,552 B2 | 9/2015 | Magno et al. |
| 2001/0036212 A1 | 11/2001 | Kopp et al. |
| 2001/0055089 A1 | 12/2001 | Van De Witte et al. |
| 2004/0069995 A1 | 4/2004 | Magno et al. |
| 2004/0265510 A1 | 12/2004 | Miroshin et al. |
| 2006/0122366 A1 | 6/2006 | Wang et al. |
| 2006/0181202 A1 | 8/2006 | Liao et al. |
| 2009/0009072 A1 | 1/2009 | Wellman et al. |
| 2009/0230851 A1 | 9/2009 | Togashi et al. |
| 2010/0237327 A1* | 9/2010 | Funahashi ........... H01L 51/0076 257/40 |
| 2011/0020566 A1 | 1/2011 | Koch |
| 2012/0099054 A1 | 4/2012 | Takeuchi et al. |
| 2013/0320307 A1 | 12/2013 | Birnstock et al. |
| 2020/0006710 A1* | 1/2020 | Koch ................... C09K 11/06 |

OTHER PUBLICATIONS

Fokumura, et al., "Alignment of Liquid Crystalline Polyfluorene Films by an Optically Aligned Polymer Layer," Japanese Journal of Applied Physics, 2006, pp. L33-L35, vol. 45 No. 1.

O'Neill, et al., "Liquid Crystals for Charge Transport, Luminescence, and Photonics,"http://www.advmat.de, Jul. 17, 2003, pp. 1135-1146, Adv. Mater. 15, No. 14.

Extended European Search Report for corresponding European Application No. 17764211.3 dated Jan. 3, 2020.

* cited by examiner

1400

BAND EDGE EMISSION ENHANCED ORGANIC LIGHT EMITTING DIODE UTILIZING CHIRAL LIQUID CRYSTALLINE EMITTER

CROSS REFERENCE TO RELATED APPLICATION

This application is a continuation of, and claims the benefit under 35 U.S.C. § 120 of the earlier filing date of, copending U.S. Ser. No. 15/999,863 filed on Aug. 22, 2018, which is a 371 National Stage of International Application No. PCT/US2017/21867, filed Mar. 10, 2017, which was published as International Publication No. WO 2017/156433, and which claims the benefit under 35 U.S.C. § 119(e) of the earlier filing date of U.S. Provisional Patent Application No. 62/306,128 filed on Mar. 10, 2016, the disclosure of which is incorporated by reference herein.

BACKGROUND

U.S. Provisional Application 62/183,771 filed on Jun. 24, 2015 is hereby incorporated by reference in its entirety.

In U.S. Pat. No. 7,335,921 filed May 8, 2003, U.S. patent application Ser. No. 10/434,941 filed May 8, 2003, and U.S. Pat. No. 9,129,552 filed May 8, 2003 light emitting diode devices (LEDs) and particularly organic light emitting diode devices (OLEDs) are described in which one or more photonic crystal structures are integrated with the light emitting diode structures so as to provide enhanced levels of light emission and energy efficiency through the phenomenon of stimulated emission. The devices described include both laser and non-laser devices. The principle of operation of these devices, that have been collectively termed feedback enhanced organic light emitting diodes (FE-OLEDs), is that light is fed back into the light emitting layers of the devices from the photonic crystals, or if only one photonic crystal from other reflective structures so as to yield stimulated emission of light from the light emitting layers. Since the direction of propagation of the feedback light is vertical to the plane of these devices, and since light produced by stimulated emission propagates in the same direction as the light stimulating the emission, nearly all light emitted from FE-OLEDs is emitted in the direction perpendicular to the plane of the device. That is to say, the devices are vertically emitting.

The nearly complete vertical emission of light in the FE-OLEDs results in greatly increased efficiency of light generation versus power input because light is not emitted with a substantially in-plane direction of propagation. Light that is emitted with a substantially in-plane direction of propagation in OLEDs and LEDs is trapped within the devices by reflection from layer to layer interfaces within the devices and eventually absorbed in the devices creating heat. Thus the vertical emission of light in FE-OLEDs results in improved energy efficiency.

FE-OLEDs are generally described as either Type 1 or Type 2. The first (Type 1 device) can be characterized as operating by means of light generation within a defect in a one-dimensional photonic crystal. Photonic crystals are dielectric media that have a periodic variation of refractive index of light through their extent. A result of the periodic variation of refractive index is that the wave equation for light propagation has no solutions over a range of wavelengths (the stop band) for light propagating in the direction(s) of periodic index variation. A result is that a light emitting material molecule embedded in the photonic crystal medium cannot emit light having wavelengths within the stop band in the direction(s) of periodic index variation. A second result is that light propagating external to the photonic crystal medium will be completely reflected from the medium's surface if it has a wavelength within the stop band and if it is traveling in the direction or in one of the directions of refractive index variation. The photonic crystal structures utilized in FE-OLEDs are usually one-dimensional in nature with the axis of refractive index variation perpendicular to the planes of the devices, in other words it is parallel to the transmission axis of the device, but higher dimensional photonic crystals may also be used.

In a Type 1 device there is a planar region (a defect) constituting a cavity within the photonic crystal medium and parallel to the plane of the device in which the regular cyclic variation of refractive index does not occur. Another way of describing this structure is that there is a phase-slip in the photonic crystal medium that produces a defect. If a light emitting molecule is embedded within the defect, the light that it emits within the wavelength stop band will be trapped within the defect by the reflective properties of the photonic crystal medium. The thickness of the defect can be made quite small with the result that the photon density of light trapped in the defect can become quite high. This results in very efficient stimulation of light emission from excited state molecules embedded in the material in the defect.

Viewed classically the defect in a Type 1 device is a micro-cavity between two photonic crystal reflectors. Light produced by emitter molecules in the micro-cavity is reflected back and forth between the two reflectors stimulating more light emission.

While the Type 1 devices take advantage of the light reflection properties of photonic crystal structures, Type 2 devices depend on the properties of light emitted inside photonic crystals. As described above, a stop band is created inside a photonic crystal structure. This is a range of wavelengths over which there are no propagation of light allowed through the cyclically varying refractive index structure. It would be tempting to think that the light propagation modes or states that exist in the stop band wavelengths in free space are destroyed when the photonic crystal structure is introduced around the light emitter. However, this is not the case. What actually happens is that the light propagation states are expelled from the stop band and are "stacked up" at its edges in the wavelength spectrum. This sort of behavior is generally quantified in terms of the density of states, that is to say the number of allowable wave propagation states or modes per interval of energy in the electromagnetic spectrum. Plots of the density of states versus light frequency for free space (dashed line) and for a photonic crystal medium (solid line) are shown in FIG. 1. In the stop band wavelength region between frequencies B and C, the density of states is zero. However, at wavelengths A and D that are slightly red and blue shifted respectively from the boundaries of the stop band, this "stacking up" phenomenon means that the densities of states in the photonic crystal medium are considerably higher than for light propagating in free space. Since the amount of light that an emitting molecule will emit into its surrounding depends on the density of states available to propagate the light, a light emitter in the photonic crystal of FIG. 1 will emit considerably more light at frequencies A and D than it would in free space.

A further property of photonic crystals is that at wavelengths (or frequencies) close to the stop band, the medium is partially transmissive and partially reflective. The result is that light emitted at these wavelengths builds up within the medium as it is localized about the point of emission. The combination of the higher than normal level of photon emission at wavelengths adjacent to the stop band combined with buildup of these photons within the medium due to internal reflections yields very high photon densities throughout the bulk of the photonic crystal medium. These high photon densities in turn ensure stimulated emission from essentially all the excited state emitter molecules embedded in the photonic crystal. Because of the one-dimensional nature of the photonic crystal structure used, the propagation direction of the light produced by stimulated emission is all in the vertical direction, just as it was in the Type 1 devices, the energy efficiency of the Type 2 devices is similarly enhanced.

Laser devices have been demonstrated in the form of chiral lasers utilizing a chiral liquid crystal doped with a fluorescent dye. The structure of an aligned chiral liquid crystal is shown in FIG. 2. Rod shaped liquid crystal molecules 210 within layers 220 tend to align with their long axes pointing in single direction parallel to an axis called the director 230. In aligned nematic liquid crystals the director always points in the same direction. However, because of the asymmetric shape of some of the molecular constituents, in chiral liquid crystals as one passes down through the material along axis 240 as shown in FIG. 2, the direction of the director 230 rotates so as to sweep out a helix. Thus the individual liquid crystal molecules combine into a helical structure. Because of the anisotropy of electronic polarization within the individual molecules, light of the proper circular polarization passing through the liquid crystalline material encounters a much higher refractive index when its associated electric vector is parallel to the molecules' long axes than when its electric vector is perpendicular to the molecules long axes. Given that the light has the proper wavelength, light of the opposite circular polarization (for instance, right-handed versus left-handed) has its associated electric vector rotated so as to track the helical structure of the liquid crystal and thus sees no change in refractive index as it passes up through the chiral liquid crystalline structure. Thus circularly polarized light of the correct handedness propagating parallel to axis 240 sees a periodically oscillating refractive index as it passes through molecules with their long axes oscillating between directions parallel and anti-parallel to the light's electric vector. In this way the assembly of chiral liquid crystalline molecules act as a one-dimensional photonic crystal material for one circular polarization of light along axis 240. The medium will have a stop band for light emission similar to that shown in FIG. 1 and there will be enhancement of the density of states near the stop band edges in the electromagnetic spectrum. If the fluorescent dye doped into this aligned chiral liquid crystal is excited to emit light (for instance, by optical pumping with light from a YAG laser) and the light produced has in its spectral band a wavelength in the chiral medium the same as one of the wavelengths at the stop band edges (analogous to A and D in FIG. 1) a buildup of photon density will occur at that band edge wavelength. These photons will stimulate further emission. In the chiral laser there is more than sufficient stimulated emission and little enough absorptive losses to enable lasing. These optically pumped dye doped liquid crystal lasers operate on a similar principle as a Type 2 solid state device except that light emission is excited by optical excitation rather than electrical excitation as in a light emitting diode. Another important aspect of the chiral liquid crystal laser devices is that the fluorescent emitter material was embedded throughout the chiral liquid crystal medium. This yielded a wide enough distribution of fluorescent material to produce sufficient laser gain to initiate lasing.

Producing a solid state Type 2 device encounters immediate issues stemming from the structures of conventional LEDs and organic light emitting diodes (OLEDs) an example 300 of which is portrayed in FIG. 3. The OLED 300 consists of a substrate 310, a transparent anode 320, a hole injection layer 330, a hole transporting layer 340, an emitter layer 350, an electron transporting layer 360, and a metal cathode 370. The device 300 functions as follows: when an electrical potential difference is applied between the anode and the cathode, positively charged holes are injected from the anode 320 into the hole injection layer 330. Under the influence of the imposed electric field the holes flow from the hole injection layer, through the hole transporting layer 340 and into the emitter layer 350. At the same time electrons are injected from the cathode 370 into the electron transporting layer 360. Under the influence of the imposed electric field the electrons flow from the electron transporting layer into the emitter layer 350. In the emitter layer the electrons and holes pair together on single organic molecules promoting the molecules into electronically excited states. These excited states (excitons) then collapse to produce light.

In OLEDs the hole injection layers 330, the hole transporting layers 340, the emitter layers 350, and the electron transporting layers 360 are all composed of organic materials, which have quite low charge carrier (electron or hole) mobilities as compared to typical inorganic semiconductor materials. In current OLEDs the total thickness of all the organic layers is less than 200 nanometers and the emitter layers have thicknesses in the range of 25 to 50 nanometers.

Inorganic Type 1 devices in which the emitter layer is located in a defect or micro-cavity between two photonic crystal structures are described in U.S. Pat. No. 4,949,350 which teaches Type 1 devices in which the light emitting material is an inorganic semiconductor such as $In_{0.2}Ga_{0.8}As$. An example of the structure of these devices is portrayed in FIG. 4 and FIG. 5. The photonic crystal structures above and below the cavity containing an emitter consist of epitaxially grown alternating layers of AlAs (lower refractive index) and GaAs (higher refractive index) with layer thicknesses corresponding to one-quarter wave thickness for light with the wavelength of 900+ nm. wavelength desired from the device.

FIG. 4 presents a top level view of the device 400. The device consists of an transparent electron conducting substrate 410, an electron conducting photonic crystal mirror 420, a spacer layer 430 that performs much the same function as an electron transporting layer in OLEDs, an emitter layer 440, a second spacer layer 450 that performs much the same function as a hole transporting layer, a hole conducting photonic crystal layer 460, a gold anode, and electrical contacts 480 and 490.

FIG. 5 presents a more detailed view of layers 420 and 430. The electron conducting photonic crystal mirror 420 consists of twenty pairs 510 of an aluminum arsenide 520 and a gallium arsenide 540 layer. Between each layer pair is a "superlattice" 530 consisting of four extremely thin (1.7 nanometers) alternating GaAS and AlAs layers. These superlattices are included to improve electrical conductivity and have no optical function. Also shown in FIG. 5 are the sub-layers that compose the first spacer layer 430. These are an ALAs layer 550, another superlattice 560, and a GaAS layer 570. Also shown is a graded index layer 580 that is intended to further confine light into the emitter layer.

Photonic crystal layer 460 is also built up from alternating AlAS and GaAs layers just as photonic crystal layer 420 was. In this example twelve layer pairs of these materials were used.

Referring back to FIG. 4, when the device is energized, electrons from substrate 410 pass through the intervening layers into emitter layer 440. At the same time holes from the anode 470 pass through the intervening layers into emitter layer 440. The electrons and holes recombine in the emitter layer to produce infrared light. This light is reflected off the two photonic crystal stacks and the photon density builds up in the cavity consisting of layers 430, 440 and 450. This high photon density produces stimulated emission at a sufficient level that lasing is induced. Devices like that shown in FIG. 4 have become known as VCSELs (vertical cavity, surface emitting lasers) and are now commonly available.

U.S. Pat. No. 6,160,828 describes an organic Type 1 device known as a VCSEL an example of which, 600, is portrayed in FIG. 6. The device consists of a transparent substrate 610, a first mirror layer 620, a first electrode 630, a hole transporting layer 640, an emitter layer 650, an electron transporting layer 660, a second electrode 670, and a second mirror layer 680. Layers 640, 650, and 660 are composed of organic materials. The patent states that the first mirror layer and/or the second mirror layer are distributed Bragg reflectors. Distributed Bragg reflectors are one-dimensional photonic crystal structures built up by successive deposition of layers of alternating high and low refractive index. As was the case in the VCSELs described in U.S. Pat. No. 4,949,350, electrons and holes recombine in the emitter layer 650 of this device producing light that is then reflected by the mirror layers back through the emitter layers stimulating further light emission. A high enough photon density is built up in the cavity between the mirrors to initiate lasing What both U.S. Pat. Nos. 4,949,350 and 6,160,828 have in common is that the photonic crystal structures disclosed as being used on either side of the cavity that confines light in the laser cavities are formed by successive deposition of many layers of light transmitting material with alternating high and low refractive indices. In the case of OLEDs the fabrication techniques used to fabricate these devices are vacuum evaporation or sputtering. In order to produce efficiently working devices, it was necessary to deposit these very thin layers and the very thin layers within the laser micro-cavities with a high degree of accuracy in terms of thickness.

FE-OLEDs in which the photonic crystal structures are built up by successive deposition of layers of transparent material have photonic crystal structures in which the refractive index profile is discontinuous. That is to say the refractive index changes abruptly and discontinuously at layer boundaries in the photonic crystal structure. This layered structure requires accurate vacuum deposition of many layers, which becomes impractical if low manufacturing costs are required or as devices become larger in size. Therefore, a similar device having a simpler method of fabrication is desired.

DETAILED DESCRIPTION

Figure 3:
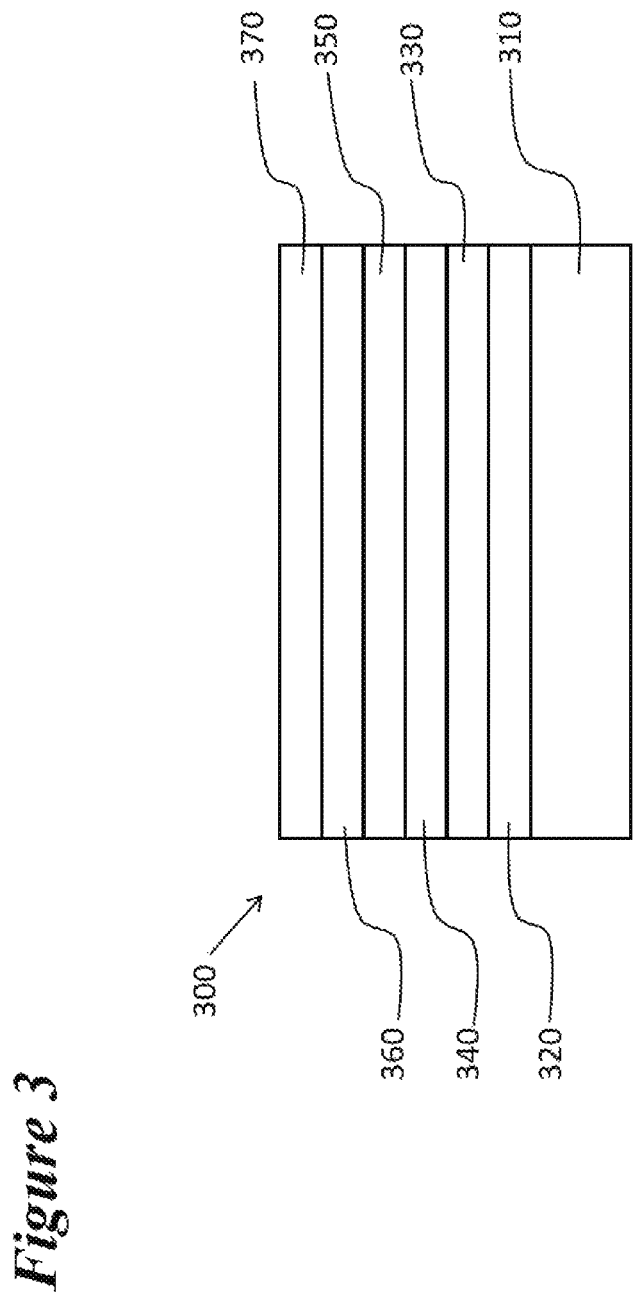
FIG. 3 illustrates an exemplary conventional organic light emitting diode.
Figure 4:
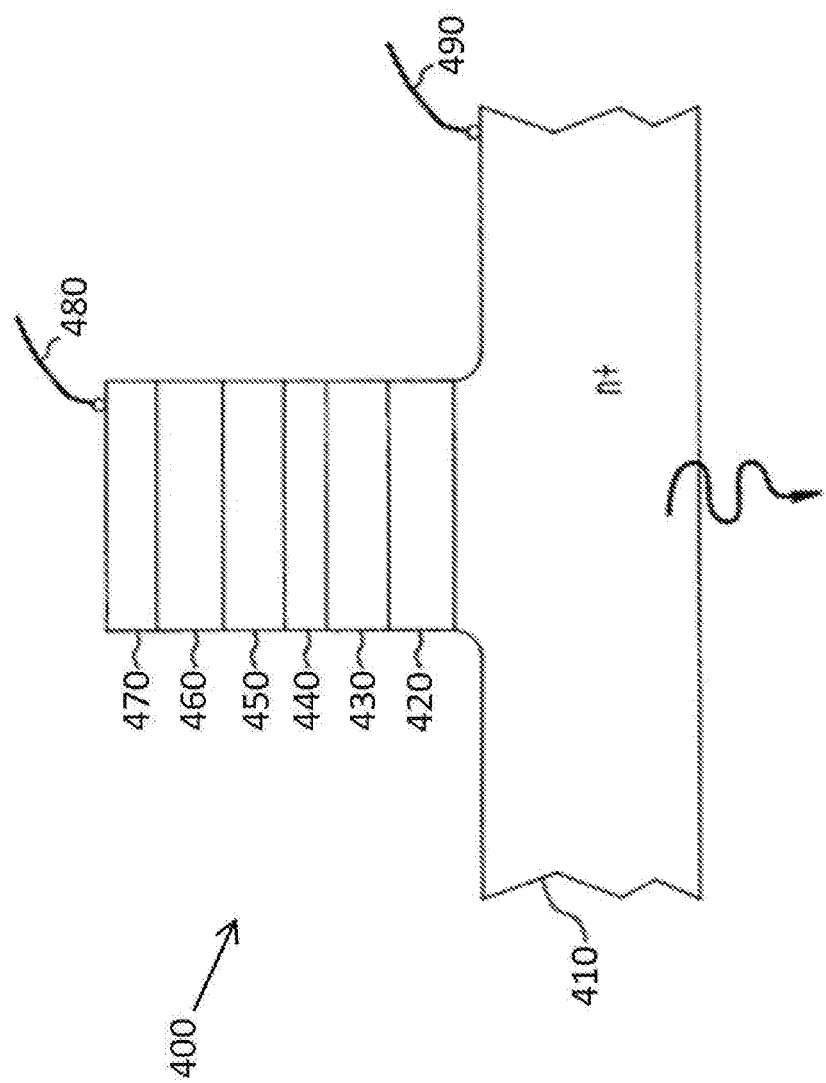
FIG. 4 illustrates an exemplary inorganic Type 1 structure.
Figure 5:
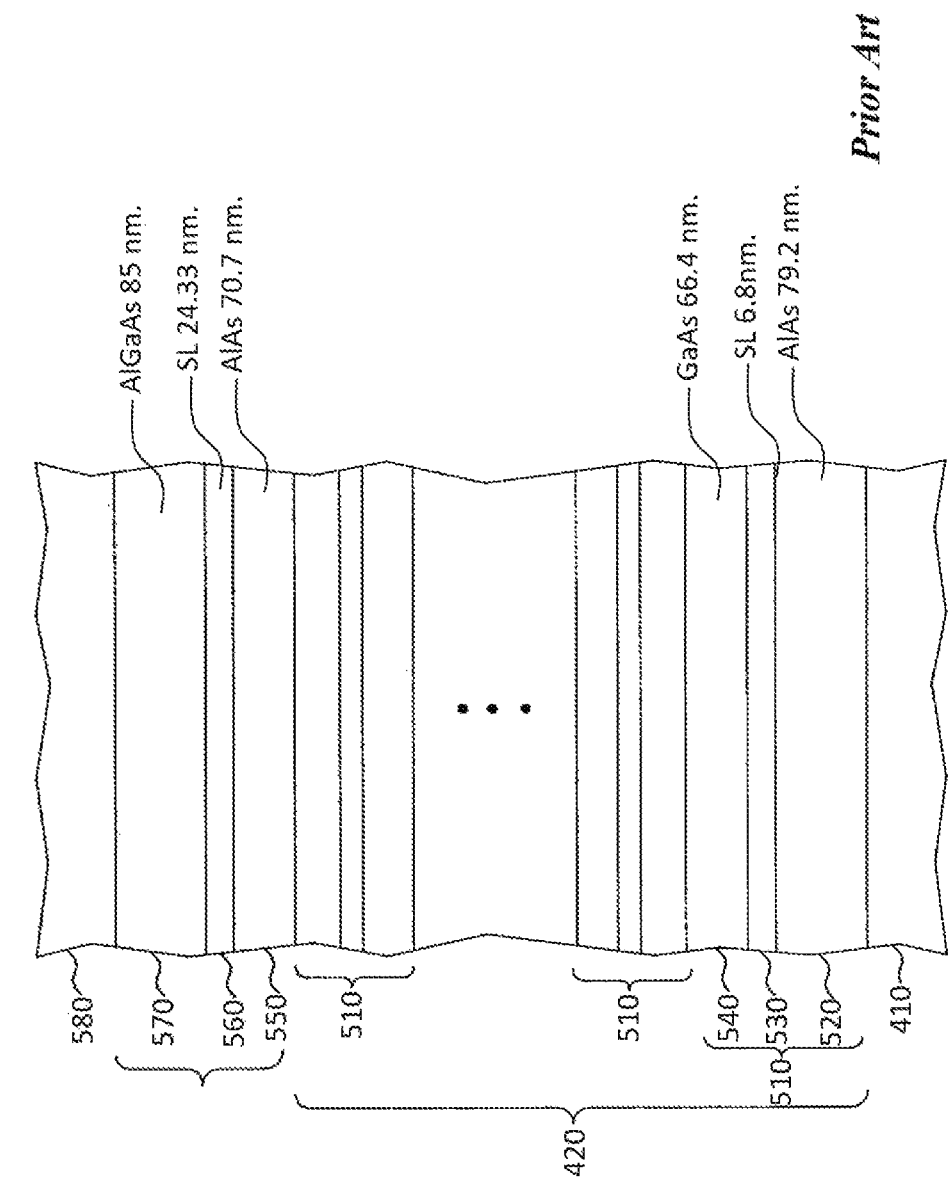
FIG. 5 illustrates an exemplary inorganic Type 1 structure.
Figure 6:
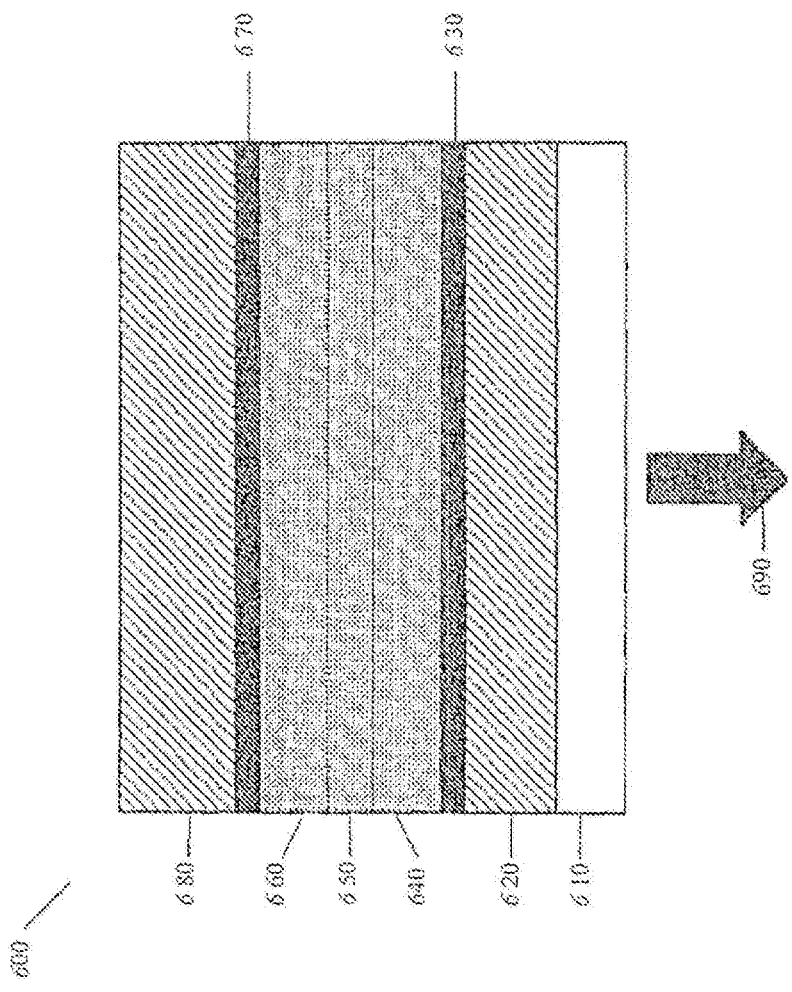
FIG. 6 illustrates an exemplary VCSEL.

In current OLEDs, e.g. those described by FIG. 3, the total thickness of all the organic layers is less than 200 nanometers and the emitter layers have thicknesses in the range of 25 to 50 nanometers. These layers are thin enough that the low charge carrier mobilities of the materials do not result in the introduction of large impedances. By contrast the chiral liquid crystalline layers doped with fluorescent dyes previously discussed are on the order of 20 microns in thickness and would have similarly low charge carrier mobilities. Thus, it is expected that in order to produce a band-edge emitting Type 2 laser device, given similar refractive index variation, the emitter layer would have to contain a photonic crystal structure around 20 microns in thickness with luminescent material doped throughout it. With an emitter layer that thick in the device very large impedance losses will occur in the OLEDs causing the devices to run at very elevated voltages and suffer thermal failure.

The Type 1 photonic crystal structures devices include holographic mirrors (plane wave holograms) and self-assembled structures such as chiral liquid crystals and synthetic opals. Devices with these types of photonic crystal structures are described in U.S. patent application Ser. No. 10/434,941. These three types of photonic crystal structures have the advantage that they can be produced in a monolithic structure, in one fabrication step, as opposed to the layer by layer approach used for the VCSEL devices described above. However, this gives rise to a serious problem. The top photonic crystal structure in such a device must be phase registered with the bottom photonic crystal structure or the desired photon density maximum at the emitter layer will not occur. The potential spatial registration of two holographic reflectors by an interferometric method has not been successfully implemented in high yields. Thus, until this time there is no proven method to fabricate Type 1 devices containing these types of photonic crystal structures in high yields at low costs for consumer applications.

Figure 1:
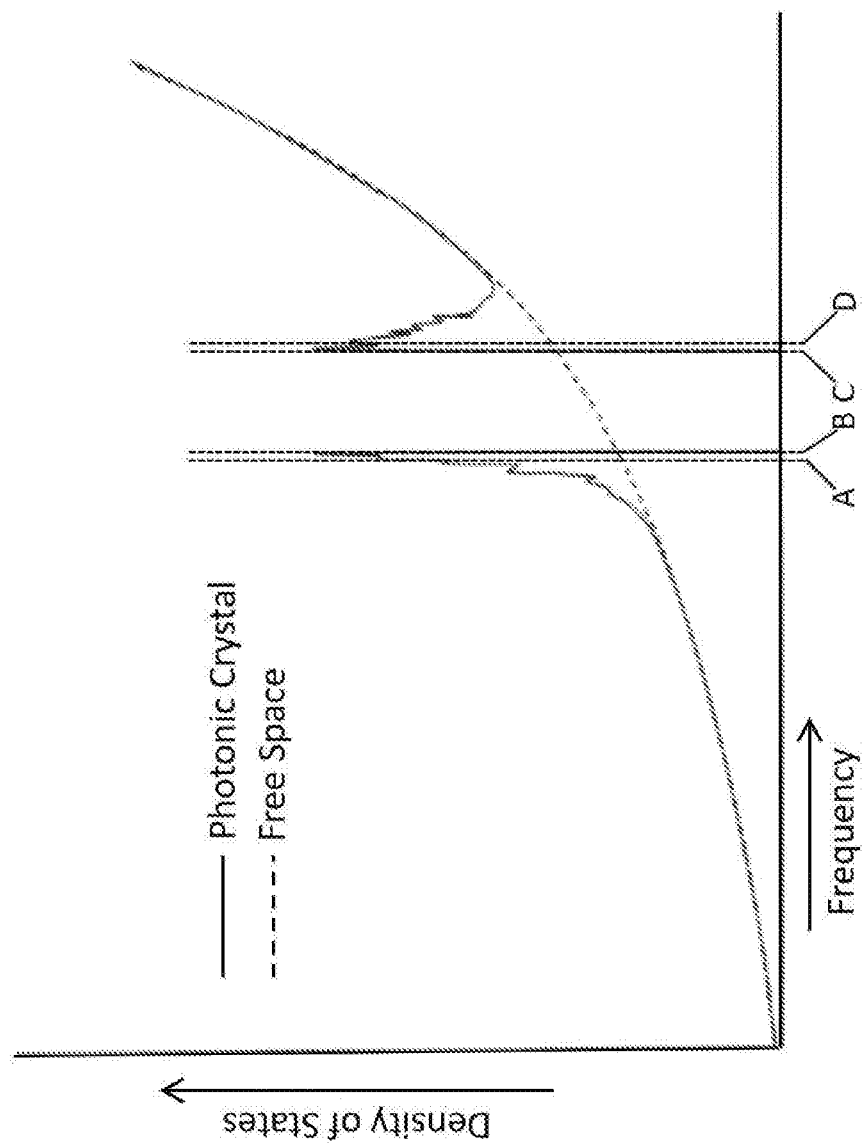
FIG. 1 illustrates plots of the density of states versus light frequency are shown for free space and for a photonic crystal medium.
Figure 2:
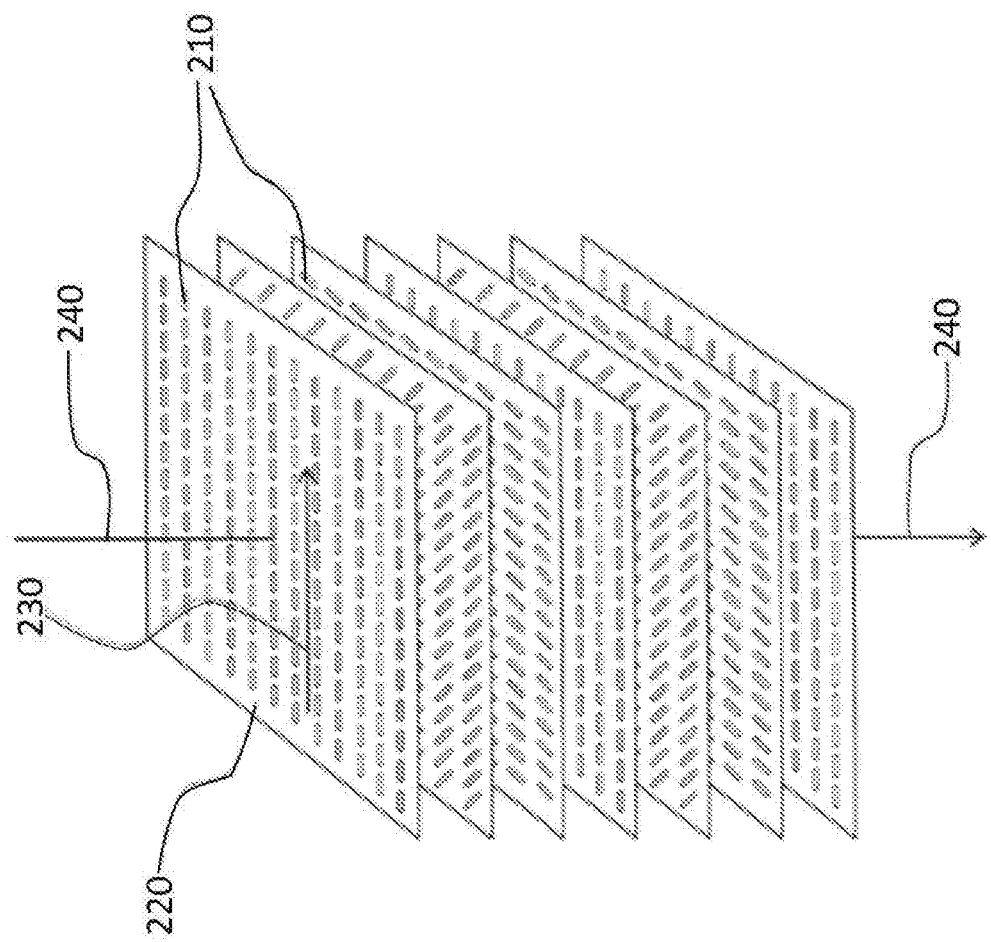
FIG. 2 illustrates an exemplary structure of an alighted chiral liquid crystal.

A solid state Type 2 device (devices in which light is generated in band-edge modes) differs from the chiral laser devices described above in reference to FIG. 2 in that the light emitting material is located in a single layer or zone, as opposed to being doped throughout a liquid crystal. Contrary to what one would expect, even though photons are distributed throughout the photonic crystal structure, the photon density in the emitter-containing layer could be made to be sufficiently high so as to yield nearly completely stimulated emission from the light emitting material in a non-laser device. Thus, as was described in U.S. Provisional Patent Application 62/183,771 it is possible to build devices in which the organic layers (the hole injection, hole transporting, light emitting, electron transporting and optional charge carrier blocking layers) are all included in a single layer or zone of the photonic crystal structure. In this way, band-edge emitting organic light emitting diodes (BE-OLEDs) are produced with luminous efficacies in excess of 300 lumens per watt.

The BE-OLEDs produced in accordance with 62/183,771 are highly advantageous in terms of their energy efficiency, operating lifetimes, and the color gamut that they can be made to produce. However, the fabrication of a single monochrome BEOLED device requires the vacuum deposition of around 20 layers of material. A band-edge emitting OLED device with simpler, more easily manufacturable structure in which the photonic crystal structure is produced utilizing chiral liquid crystals is disclosed.

The basic concept behind the invention is that a series of photopolymerizable, chiral liquid crystalline layers can be solvent cast on a substrate. As each layer is deposited, it is photopolymerized, locking the chiral liquid crystal structure in place in a robust polymer matrix. When the next layer is solvent cast on top of the preceding layer, the uppermost layer of molecules in the underlying polymerized layer acts as a template aligning the bottom layer of molecules in the fluid overlying layer. Once this overlying layer is properly aligned it is in turn photopolymerized. If required, a third and then still more photopolymerizable chiral liquid crystal layers can be solvent cast on top of the second, in turn being aligned and photopolymerized.

The mixture of chiral materials in each successive layer may be blended in such a way that each layer has the same chiral pitch. Further the chiral materials in each layer may also be blended so that the ordinary and extraordinary refractive indices in each layer match the other layers. By matching the chiral pitch and the ordinary and extraordinary refractive indices of the materials in this way, the resulting assembly of layers is an optically uniform assembly of chiral liquid crystalline polymer. That is to say, the complete assembly of layers will optically function as a single relatively thick layer of chiral liquid crystal. An important aspect of such a layered assembly is that the pitch of the helical structure of the chiral liquid crystal and its vertical (normal to the layer boundaries) position in space need in no way be related to the layer boundaries within the structure. If the central layers in the chiral liquid crystal assembly are the active organic layers of an OLED (e.g. the emitter layer, the charge transporting and injection layers), these layers could be located in any vertical position relative to the refractive index alternation and could have any thickness dictated by the electrical requirements of the device. Thus in the chiral device structure the electronic device structure is deconstrained from the optical device structure.

Figure 7:
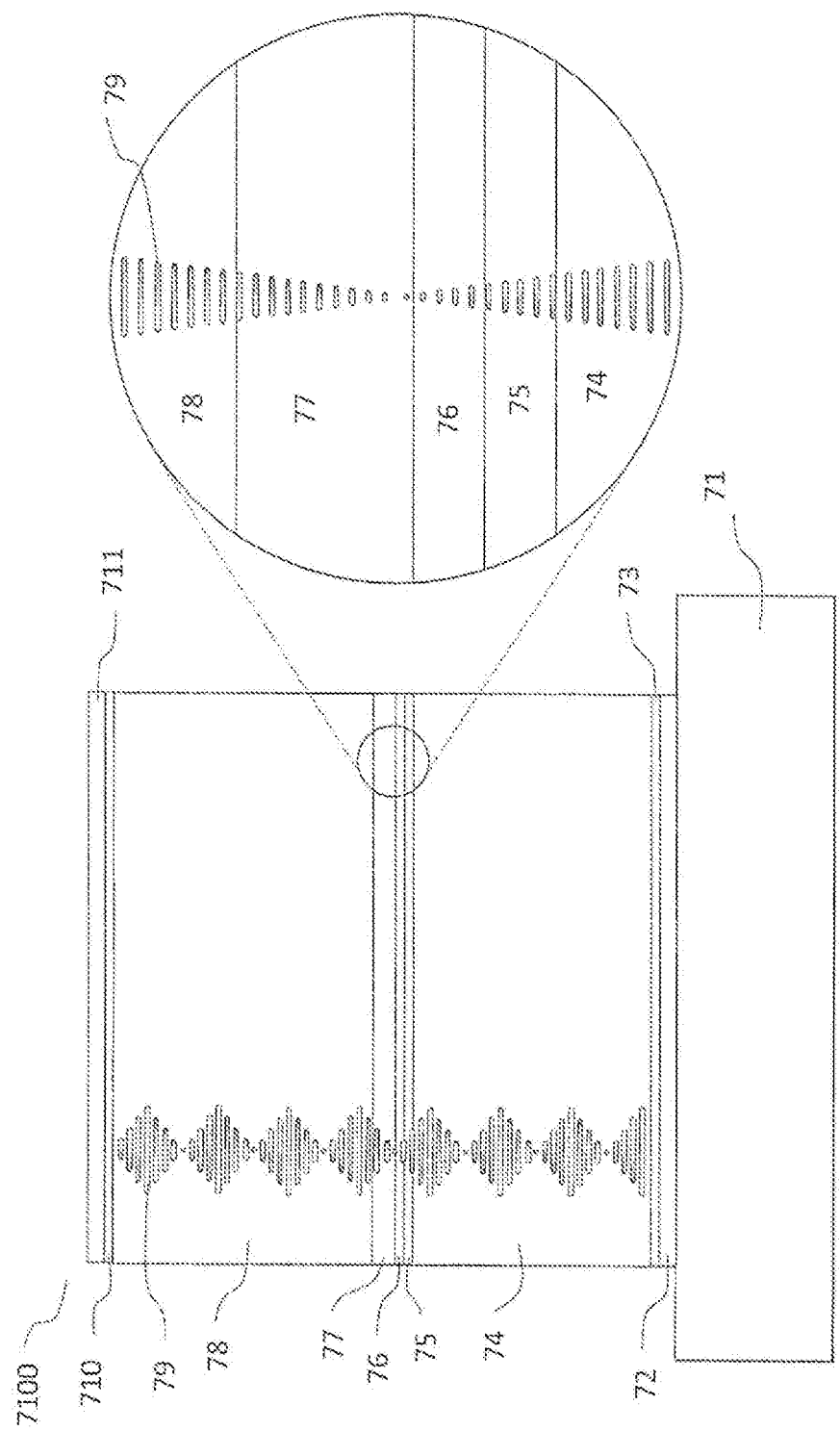
FIG. 7 illustrates various embodiments of a chiral liquid crystalline light emitting device.
Figure 8:
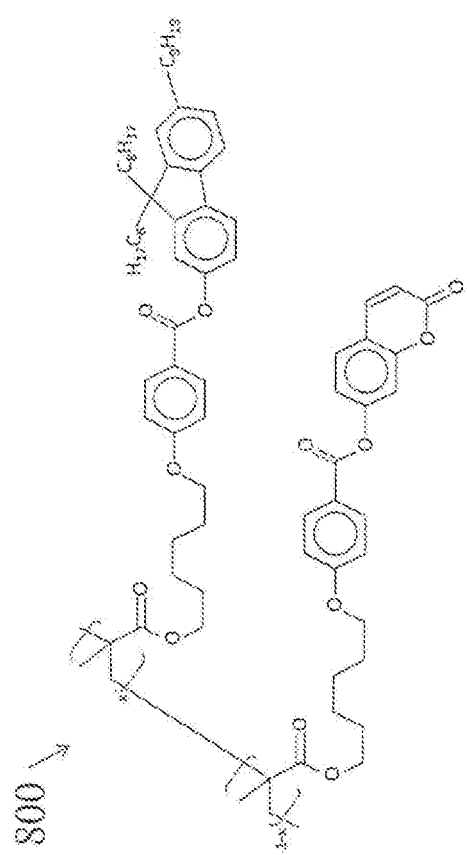
FIG. 8 illustrates a representation of a representative hole transporting, photoalignment layer.
Figure 9:
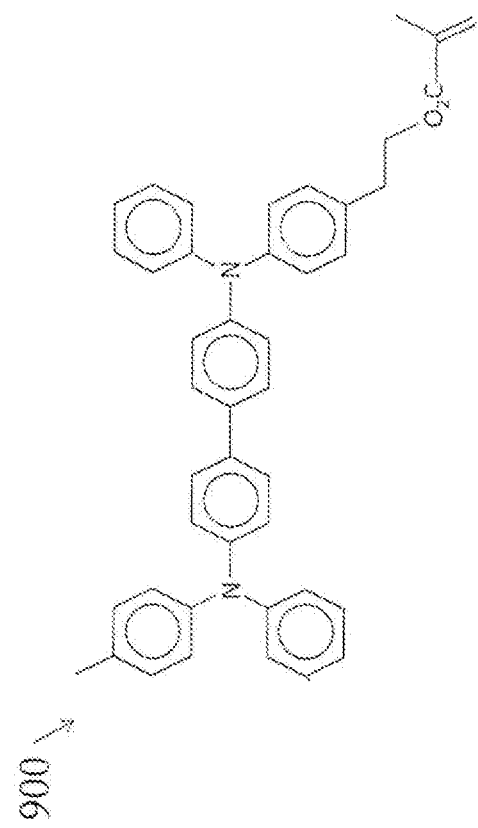
FIG. 9 photopolymerized copolymer of a monomeric hole transporting.
Figure 10:
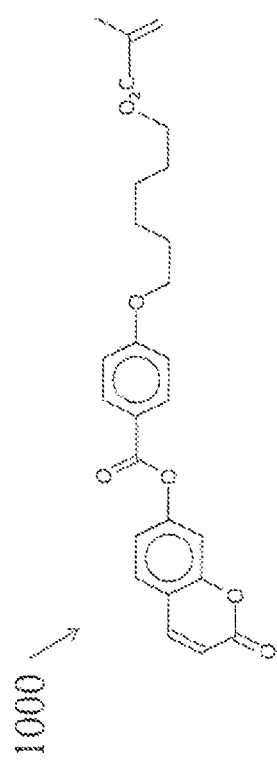
FIG. 10 material monomeric liquid crystal photoalignment material.

FIG. 7 portrays various embodiments of a chiral liquid crystalline light emitting device. The device is built up layer by layer on a transparent substrate 71 composed of any suitable materials, for instance glass or clear plastic. First a clear, electrically conducting anode layer 72 is coated onto the substrate, most often by vacuum deposition. This anode layer may comprise a transparent semiconducting material such as indium zinc oxide or indium-tin oxide. Next a hole transporting, liquid crystal photoalignment layer 73 is coated onto the substrate surface. U.S. Pat. No. 7,118,787 and US Patent Application 2011/0020566 disclose various materials that can be used as such a hole transporting layer in various embodiments of a chiral liquid crystalline light emitting device. For example, an exemplary prepolymerized and solvent cast hole transporting liquid crystal photoalignment material 800, is shown in FIG. 8. Alternatively an exemplary photopolymerized copolymer of a monomeric hole transporting material 900 (illustrated in FIG. 9) and a monomeric liquid crystal photoalignment material 1000 (illustrated in FIG. 10) may be used to form layer 73. In this case, layers are produced by solvent casting a mixture of the two monomers onto the surface of the anode layer and photopolymerizing them in place. Liquid crystal photoalignment layers of this type are produced by first forming the layer as described above and then exposing it to polarized UV light (e.g. at a wavelength of 325 nm). This polymerizes the double bonds in the coumarin functional units aligned along one axis in the in the molecules of the layer, but not along the perpendicular axis in the plane of the layer. This, in turn, produces an anisotropic surface energy at the surface of the alignment layer that aligns liquid crystal molecules coated over it.

Figure 11:
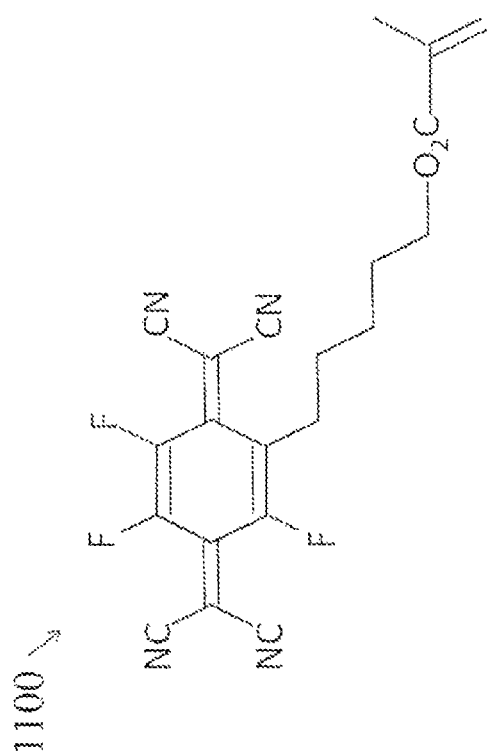
FIG. 11 illustrates a representative strongly electron accepting monomeric dopant.

The next layer to be fabricated as shown in FIG. 7 is a p-doped hole transporting layer 74. The goal in the fabrication of this layer is to produce a relatively high conductivity film that minimizes the voltage drop between the anode and the emitter layer 76. This is accomplished by doping a monomeric chiral liquid crystalline hole transporting material with a strongly electron accepting monomeric p-dopant 1100 illustrated in FIG. 11.

Figure 12:
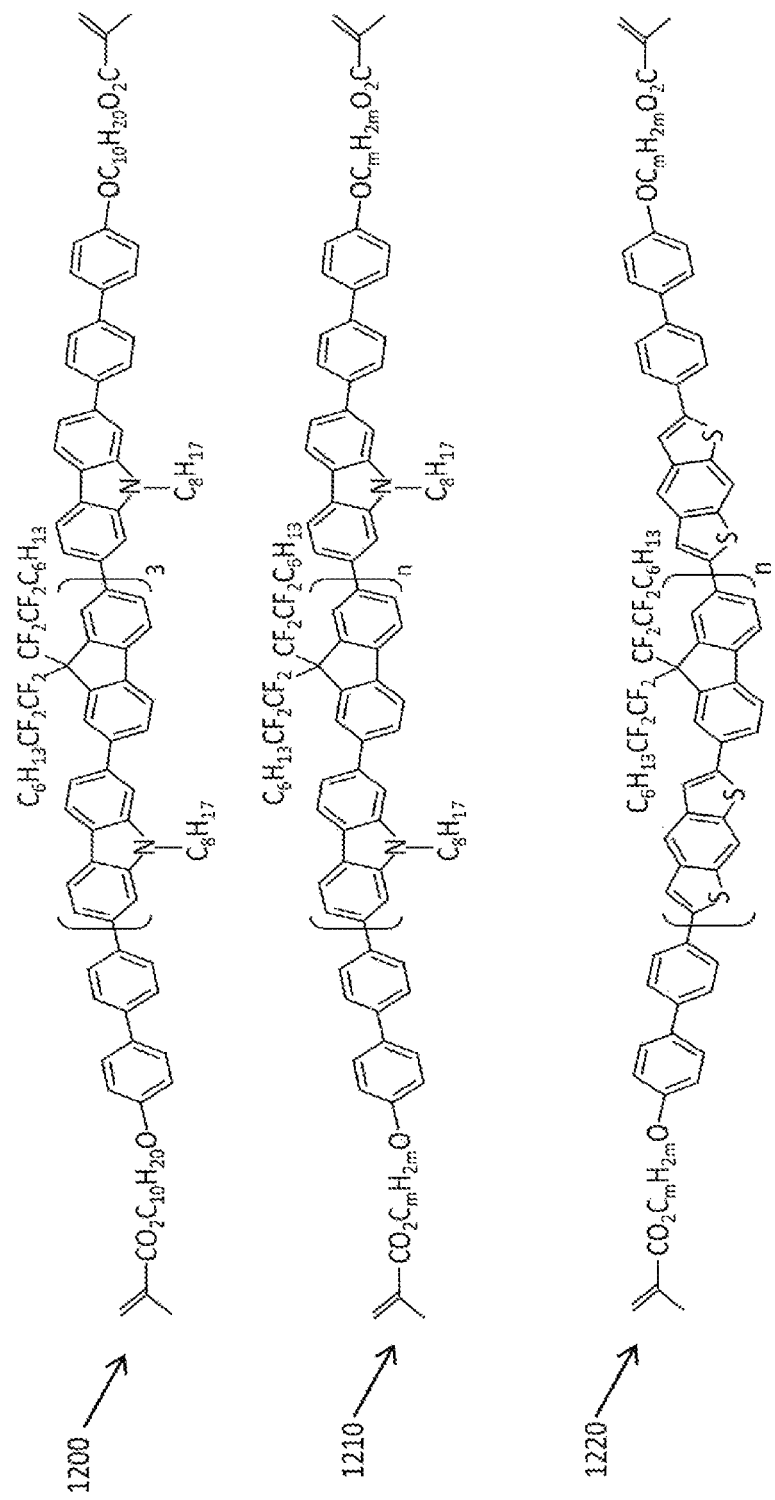
FIG. 12 illustrates representative hole transporting liquid crystalline materials.

In order to achieve a complete photonic stop band in a relatively thin layer of chiral material it is necessary that the chiral nematic monomers used to produce layer 74, shown in FIG. 7, and the other chiral liquid crystalline layers in the device have a very high ratio of their extraordinary refractive indices to their ordinary refractive indices. This, in turn, means that their molecules' long axes be much longer than the molecules are wide. An example of such a hole transporting liquid crystalline material 1200 is illustrated in FIG. 12. An alternate representation of such a hole transporting liquid crystalline material 1210 is also shown, where n=3 and m=10. Materials with m having other values between 5 and 12 may also be used. Another example of these types of materials 1220 is also shown in FIG. 12. Here material 1220, has an n value of 3 and an m value of between 5 and 12, may be used in this layer.

Since all of the chiral liquid crystalline polymer layers in the device need to be matched in terms of ordinary and extraordinary refractive indices, it may be necessary to introduce less birefringent liquid crystalline monomer materials into the mixture of materials in this layer to tune the refractive indices. For instance, compounds having the above formulas with n=1 or 2 might be used as additives to tune refractive index.

Figure 13:
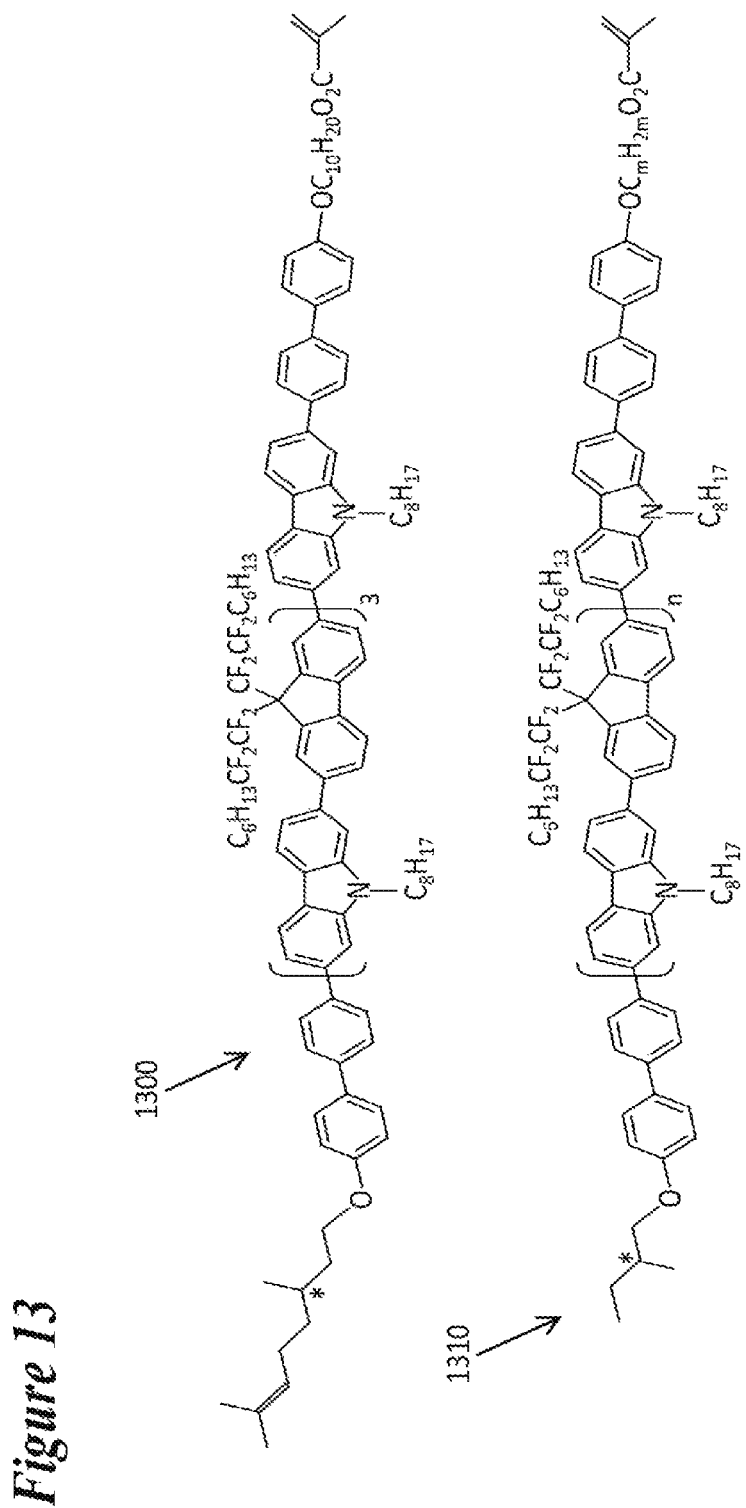
FIG. 13 illustrates representative chiral dopants.

In order to produce a chiral liquid crystalline polymer of the required pitch, it is necessary to dope the monomer mixture used to produce layer 74 in FIG. 7 with a chiral dopant. Exemplary chiral dopants are illustrated by general formula 1300 shown in FIG. 13. Chiral dopants 1300 have an n value of 1 to 3 and an m value of 5 to 12 and the molecular center of asymmetry is highlighted by the asterisk. Alternatively chiral dopants illustrated by formula 1310, also shown in FIG. 13 may be used, dopants 1310 have an n value of 1 to 3 and an m value of 5 to 12 and the molecular center of asymmetry is highlighted by the asterisk.

Referring back to FIG. 7 the mixture of monomers and p-dopant 1100 to be used to form layer 74 is solvent cast over the photoalignment layer 73 and solvent is allowed to evaporate off either at room temperature or an elevated temperature. Once the solvent is gone the material is in the form of a layer of chiral nematic liquid crystalline fluid or possibly a chiral nematic liquid crystalline glass. The anisotropic surface energy at the top surface of layer 73 induces the molecules of the chiral nematic material at the interface between layers 73 and 74 to be aligned with their molecular long axes surface parallel and with their molecular long axes all substantially in the same direction thus producing the desired helical structure in layer 74. [0050] The next layer to be fabricated in the layer by layer process is the hole transporting layer 75. The function of this layer is to convey electrically conducting holes from p-doped layer 74 into emitter layer 76. In doing so the holes transition in energy from the highest occupied molecular orbital (HOMO) levels in the conductive dopant in layer 74 to the HOMO energy levels of emitter layer 76. The layer is produced by the solvent casting of a solution of a mixture of chiral nematic liquid crystalline monmers in a manner similar to that used to produce layer 74 except that there is no p-dopant in the mixture. After the solvent used to cast the monomeric mixture evaporates away the material of the mixture forms a layer of chiral nematic liquid crystalline fluid or a chiral nematic glass on the top surface of layer 74. The liquid crystalline order of layer 74 provides a template such that the long axes of the molecules at the bottom surface of layer 75 are aligned parallel with the long axes of the nematic molecular cores of the polymeric material at the top surface of layer 74. In this way the helical structure induced by the chiral nature of the materials in layers 74 and 75 is continuous in passing across the interface between the two layers. Once the material of layer 75 is in place and properly aligned it is polymerized by exposure to ultraviolet light. The chiral nematic monomeric materials that are used to form layer 75 may be the same as were used to produce layer 74 except that the p-dopant is omitted. The exact chemical structure of the molecules used and their molecular lengths is dictated by the requirement that the ordinary and extraordinary refractive index components of the mixtures in the two layers must match each other and the helical pitches of the chiral nematic structures within the two layers must also be the same.

Figure 14:
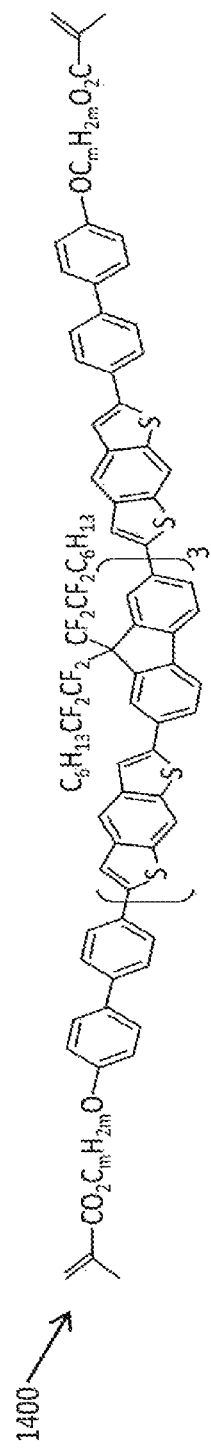
FIG. 14 illustrates a representative emitter material.

The emitter layer 76 of the device may consist solely of a monomeric nematic electroluminescent material doped with a chiral additive to produce a helical structure of the proper pitch. One suitable electroluminescent nematic material 1400 is illustrated in FIG. 14. However, a more preferable formulation for the material in this layer is to utilize an electroluminescent dopant doped into a host composed of a mixture of monomeric chiral nematic materials. This approach has a number of advantages, for example, the dopant concentration may be chosen so as to minimize self-absorption of light by the dopant; the monomeric host chiral nematic materials may be blended to produce a mixture that is ambipolar, that is to say, electron and hole mobilities are approximately equal; and non-liquid crystalline emitter materials such as phosphorescent emitters with very high quantum efficiencies may be utilized as dopants while maintaining the desired helical structure of the chiral host.

Rays of light that are entrained in the helical photonic crystal structure have their associated electric vectors all oriented parallel to the planes of the device layers. As a result, this light will only interact with excited molecules whose transition moments are also substantially in the plane of the device. Therefore, electroluminescent materials whose molecules are preferentially oriented so that their transition moments are in the device plane will yield the highest device energy efficiencies (external quantum efficiencies) when used in the emitter layers of the devices of this invention.

Figure 15:
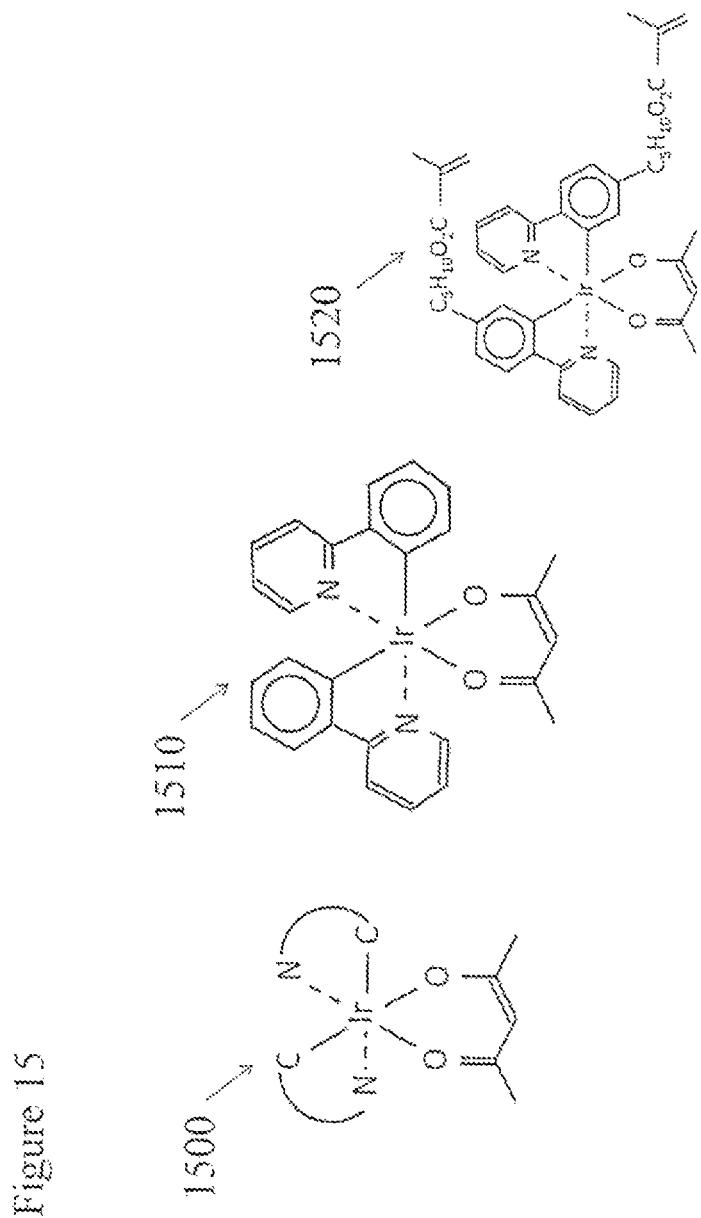
FIG. 15 illustrates representative emitter host materials.

Some emitter layer host materials spontaneously align with their long axes in the plane of the emitter layer upon vacuum deposition in the fabrication of small molecule OLEDs. When these host materials are doped with phosphorescent heteroleptic phosphorescent iridium organometallic dopants containing general structure 1500, illustrated in FIG. 15, the light emitting dopants are aligned with their transition moments in the plane of the layer.

In these molecules the iridium is complexed to a single molecule of the bidentate ligand acetylacetone (2,4-cyclopentanedione). It is also bound by covalent iridium to carbon bonds to two bidentate ligands each of which are also bound to the iridium by a coordinate iridium to nitrogen bond. An example of such a molecule, 1510, is $Ir(ppy)_2(acac)$.

When doped at a concentration of 8% into the host material 4,4'-bis(carbazol-9yl)biphenyl (CBP) in the emissive layer of a vacuum deposited, small molecule OLED device, this green light emissive material yields unusually high emission efficiency because the molecules of the phosphorescent material are aligned with their transition moments largely inplane. A monomeric version, 1520 of this material may be doped into a chiral nematic monomer host and the resulting mixture is used to form layer 76 of FIG. 7.

Figure 16:
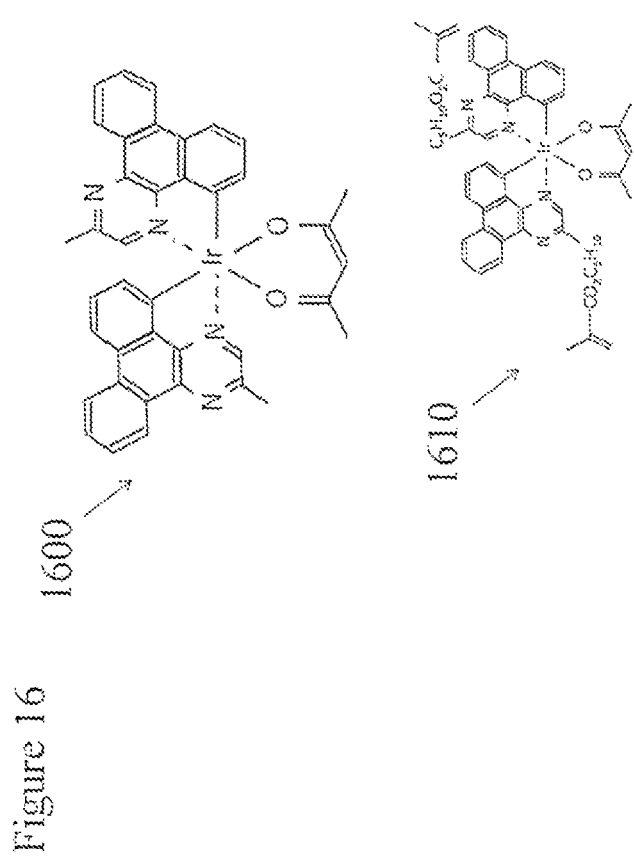
FIG. 16 illustrates representative dopants and host materials for an emissive layer.

Similarly, the red emissive material, 1600 illustrated in FIG. 16, bis(2methyldibenzo[f,h]quinoxaline)(acetylacetonate)iridium III [$Ir(MDQ)_2(acac)$] may be doped into the host material N,N'di(naphthalen-1-yl)-N,N'-diphenylbenzidene (NPB) in the emissive layer of a vacuum deposited, small molecule OLED device yielding in-plane alignment of the emitter transition moments A monomeric version, 1610 of this material is also illustrated in FIG. 16, which may be doped into a chiral nematic monomer host and this mixture used to form layer 76.

The use of an ambipolar host material in layer 76 allows for balanced injection of electrons and holes into the emitter layer with recombination to yield excitons occurring away from the layer boundaries avoiding traps that may exist at the layer boundaries. Blending a hole transporting, monomeric, chiral nematic host material with an electron transporting, monomeric, chiral nematic host material may be used to produce an ambipolar host material. Examples of hole transporting host materials are illustrated by general formula 1700 in FIG. 17.

Figure 17:
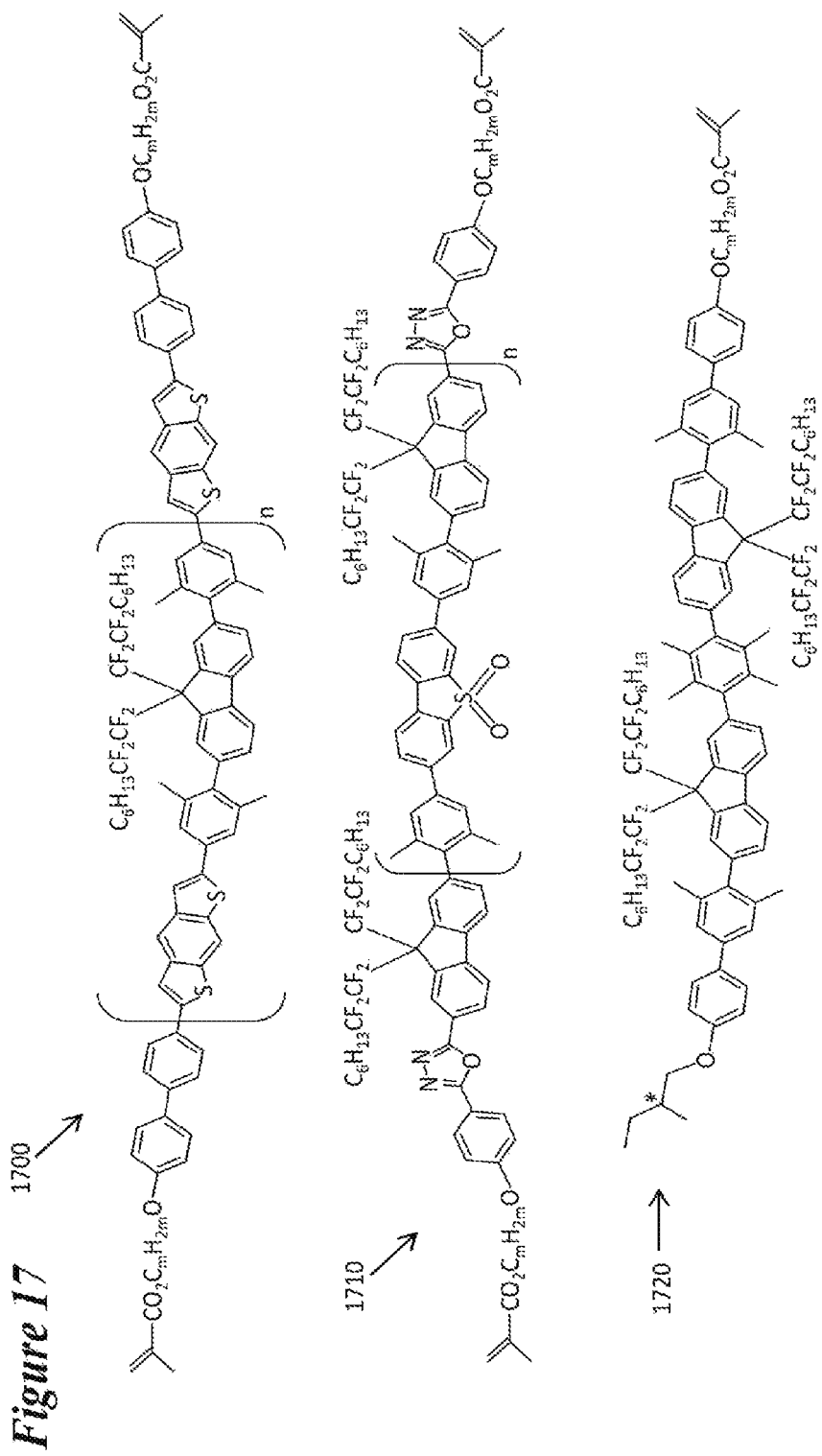
FIG. 17 illustrates representative electron and hole transporting host materials.

Similarly examples of electron transporting host materials are illustrated by general formula 1710. These materials that may be blended with materials 1700 to produce an ambipolar host mixture are also shown in FIG. 17.

By blending appropriate amounts of the two type of compounds, an ambipolar mixture can be achieved. Further, by blending materials with suitable values of n, a mixture with the right extraordinary and ordinary refractive indices to match the indices of layers 74 and 75, the helical pitch of the mixture may be adjusted based on the amount of a chiral dopant added. Examples of chiral dopants, 1720 are illustrated in FIG. 17, where m=5 to 12 and the molecular center of asymmetry is highlighted by the asterisk.

The next device layer to be fabricated is the electron transporting layer 77. The function of this layer is to convey electrons from n-doped layer 78 into emitter layer 76. In doing so the electrons transition in energy from the electron energy levels in the conductive dopant in layer 78 to the HOMO energy levels of emitter layer 76. The layer is produced by the solvent casting of a solution of a mixture of chiral nematic liquid crystalline monmers in a manner similar to that used to produce previous layers. After the solvent used to cast the monomeric mixture evaporates away, the material of the mixture forms an aligned layer of chiral nematic liquid crystalline fluid or a chiral nematic glass due to the template effect from the underlaying layer. In this way the helical structure induced by the chiral nature of the materials in layer 77 and all the previous layers in the device is continuous in passing across the interfaces between the two layers. The helical structure is polymerized so as to lock it into place by exposure to UV light.

Figure 18:
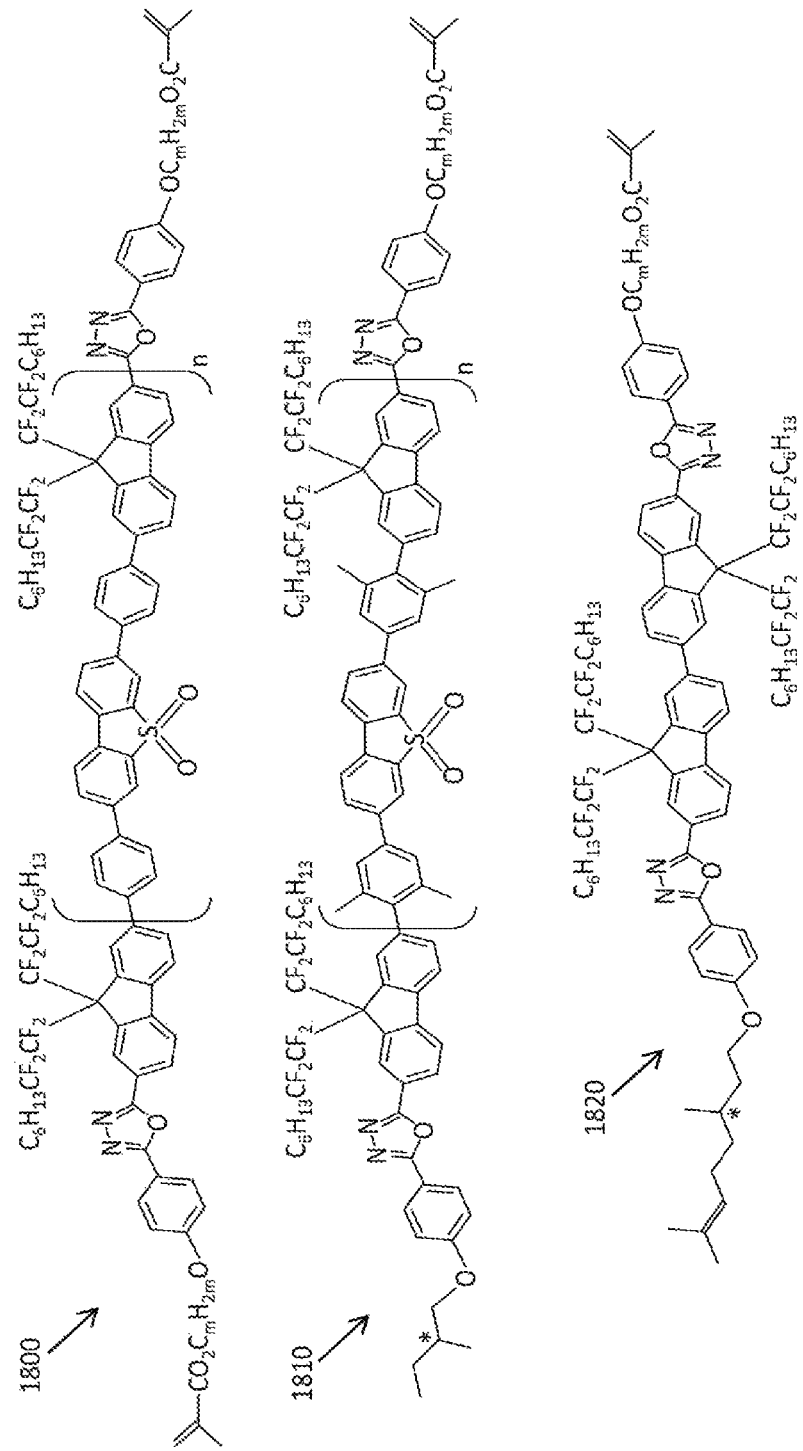
FIG. 18 illustrates representative electron transport materials and chiral dopants.

Electron transporting 77 is fabricated from a mixture of monomeric nematic materials, examples 1800 of which are illustrated in FIG. 18 where n is 1 to 3 and m is 5 to 12. By blending materials that are members of this series with suitable values of n, a mixture with the right extraordinary and ordinary refractive indices to match the indices of layers 74, 75 and 76 may be formulated. The helical pitch of the mixture may be adjusted based on the amount of a chiral dopant added. Examples of chiral dopants 1810 that may be used are illustrated in FIG. 18 where n=1 to 3, m=5 to 12, and the molecular center of asymmetry is highlighted by the asterisk. Examples of other chiral dopants, 1820, that may be used are further illustrated in FIG. 18, where m=5 to 12 and the molecular center of asymmetry is highlighted by the asterisk.

Figure 19:
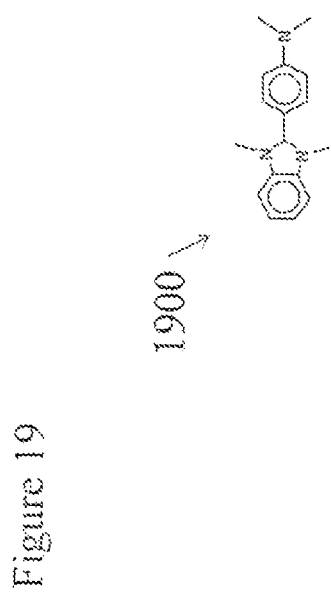
FIG. 19 illustrates a representative n type dopant.

The next device layer to be fabricated is the n-doped electron transporting layer 77. The function of this layer is to convey electrons from the cathode 710 or possibly from an optional electron injection layer 78 into the electron transporting layer 77. In doing so the electrons transition in energy from the electron energy level of the cathode work function to the lowest unoccupied molecular orbital (LUMO) energy levels of the electron transporting layer 77. The layer is produced by the solvent casting of a solution of a mixture of chiral nematic liquid crystalline monmers in a manner similar to that used to produce previous layers. The layer also incorporates an n-dopant, 1900 such as the dopant (4-(1,3-dimethyl-2,3-dihydro-1Hbenzoimidazol-2-yl)phenyl)dimethylamine (N-DBMI), as illustrated in FIG. 19, which is activated by heating after the film is solvent cast.

After the solvent used to cast the monomeric mixture evaporates away, the material of the mixture forms an aligned layer of chiral nematic liquid crystalline fluid or a chiral nematic glass due to the template effect from the underlaying layer. In this way the helical structure 79 induced by the chiral nature of the materials in layer 78 and all the previous layers in the device is continuous in passing across the interfaces between the two layers. The helical structure is polymerized so as to lock it into place by exposure to UV light.

Layer 78 may fabricated using the same mixture of monomeric nematic materials as were used for layer 77, for example 1800, where n=1 to 3 and m=5 to 12. By blending materials that are members of this series with suitable values of n a mixture with the right extraordinary and ordinary refractive indices to match the indices of layers 74, 75, and 76 may be formulated. The same chiral dopants may also be used to adjust the pitch of the helical structure, for example 1810 where n=1 to 3, m=5 to 12, and the molecular center of asymmetry is highlighted by the asterisk as shown in FIG. 18; and 1820 where m=5 to 12 and the molecular center of asymmetry is highlighted by the asterisk as also shown in FIG. 18.

Optionally layer 78 may be capped with an electron injection layer 710. Layer 710, for example, may comprise lithium fluoride or cesium carbonate. Layer 711 is a cathode and may, for example, be made from a low work function metal such as aluminum. A major advantage of the devices of this invention over those of U.S. Provisional Application 62/183,771 is that cathode 711 is not integral to the photonic crystal structure and therefore need not be transparent or have a particularly well controlled thickness. The cathodes in the devices of U.S. Provisional Application 62/183,771 must be transparent as possible to avoid light loss and constitute a refractive index zone or part of a zone in the photonic crystal and thus must have very tightly controlled thicknesses. To meet these requirements the cathodes in the devices of U.S. Provisional Application 62/183,771 are often multilayered in nature and are challenging to fabricate properly. The cathodes of the devices in this invention are simple and easily fabricated.

When device 7100 is energized, holes flow from anode 72 through hole injection layer 72 and layers 74 and 75 into emitter layer 76. At the same time electrons flow from cathode layer 711 through layers 710, 78 and 77 into emitter layer 76. The electrons and holes recombine on luminescent material molecules in layer 76 yielding excitons. Since emitter layer 76 is inside a photonic crystal structure, excitons created in that layer cannot emit light at wavelengths in the stop-band of the photonic crystal. However, where the emission band of the luminescent material in layer 76 overlaps the band-edge wavelengths of the stop-band, light emission does occur and because of the high density of states at those wavelengths unusually high levels of emission occur. The photonic crystal traps the light from band-edge emission within its structure increasing the photon density to the point where there are sufficient photons to interact with excitons to the extent that nearly all light emission is stimulated emission. There is, however, an insufficient level of stimulated emission to produce lasing. Since the light from stimulated emission is almost completely vertical in its direction of propagation within the device, there is very little loss due to internal reflection and trapping of light and the device is as a result highly energy efficient.

What is claimed is:

1. A light emitting device, comprising:
   a first hole transporting layer comprising a polymerized chiral nematic liquid crystal material that is doped with a p-dopant;
   a second hole transporting layer comprising a polymerized chiral nematic liquid crystal material;
   a light emitting layer comprising a polymerized chiral nematic liquid crystalline material;
   an electron transporting layer comprising a polymerized chiral nematic liquid crystal material;
   wherein said polymerized chiral nematic liquid crystal materials in each layer have an extraordinary refractive index and an ordinary refractive index and a difference between said extraordinary and ordinary refractive indices of the polymerized chiral nematic liquid crystal material in each of said layers varies by less than 10% from a difference between said extraordinary and ordinary refractive indices of the polymerized chiral nematic liquid crystal material in each other of said layers.

2. The light emitting device of claim 1 wherein the extraordinary refractive indices of the polymerized chiral nematic liquid crystal material in each of said layers vary by less than 10% from the extraordinary refractive indices of the polymerized chiral nematic liquid crystal material in each of the other said layers.

3. The light emitting device of claim 1 wherein the ordinary refractive indices of the polymerized chiral nematic liquid crystal material in each of said layers vary by less than 10% from the ordinary refractive indices of the polymerized chiral nematic liquid crystal material in each of the other said layers.

4. The light emitting device of claim 1 further comprising: an anode; and a hole injection layer comprising a liquid crystal alignment layer; wherein said hole injection layer lies between said anode and said first hole transporting layer.

5. The light emitting device of claim 4 wherein said liquid crystal alignment layer comprises liquid crystal alignment properties that are induced by exposure to plane polarized ultraviolet light.

6. The light emitting device of claim 1 wherein each of said layers comprises a plane and the chiral nematic liquid crystal material comprising each one of said layers comprises molecules with long axes aligned parallel with said plane of each one of said layers.

7. The light emitting device of claim 1 wherein the chiral nematic material in each one of said layers spontaneously adopts a helical structure with a helical pitch, wherein said helical pitch of said helical structure of the chiral nematic material in each of said layers is the same within each layer.

8. The light emitting device of claim 1 wherein the chiral nematic material comprising the light emitting layer is doped with an electroluminescent material.

9. The light emitting device of claim 8 wherein said light emitting layer further comprises a plane and said electroluminescent material comprises molecules with transition moments responsible for electroluminescent light emission aligned parallel with said plane of the layer the light emitting layer.

10. The light emitting device of claim 1 wherein each of said layers has a thickness and said light emitting layer has a thickness that is 10% or less of the a total thickness that is a sum of each respective thickness of all the layers each respective layer comprising polymerized chiral nematic liquid crystal material combined.

11. A light emitting device, comprising:
a hole transporting layer comprising a polymerized chiral nematic liquid crystal material; a light emitting layer comprising a polymerized chiral nematic liquid crystalline material; a first electron transporting layer comprising a polymerized chiral nematic liquid crystal material; and
a second electron transporting layer comprising a polymerized chiral nematic liquid crystal material that is doped with an n-dopant,
wherein said polymerized chiral nematic liquid crystal materials in each layer have an extraordinary refractive index and an ordinary refractive index and a difference between said extraordinary and ordinary refractive indices of the polymerized chiral nematic liquid crystal material in each of said layers varies by less than 10% from a difference between said extraordinary and ordinary refractive indices of the polymerized chiral nematic liquid crystal material in each other of said layers.

12. The light emitting device of claim 11 wherein the extraordinary refractive indices of the polymerized chiral nematic liquid crystal material in each of said layers vary by less than 10% from the extraordinary refractive indices of the polymerized chiral nematic liquid crystal material in each of the other said layers.

13. The light emitting device of claim 11 wherein the ordinary refractive indices of the polymerized chiral nematic liquid crystal material in each of said layers vary by less than 10% from the ordinary refractive indices of the polymerized chiral nematic liquid crystal material in each of the other said layers.

14. The light emitting device of claim 11 further comprising: an anode; and a hole injection layer comprising a liquid crystal alignment layer; wherein said hole injection layer lies between said anode and said first hole transporting layer.

15. The light emitting device of claim 14 wherein said liquid crystal alignment layer comprises liquid crystal alignment properties that are induced by exposure to plane polarized ultraviolet light.

16. The light emitting device of claim 11 wherein each of said layers comprises a plane and the chiral nematic liquid crystal material comprising each one of said layers comprises molecules with long axes aligned parallel with said plane of each one of said layers.

17. The light emitting device of claim 11 wherein the chiral nematic material in each one of said layers spontaneously adopts a helical structure with a helical pitch, wherein said helical pitch of said helical structure of the chiral nematic material in each of said layers is the same within each layer.

18. The light emitting device of claim 11 wherein the chiral nematic material comprising the light emitting layer is doped with an electroluminescent material.

19. The light emitting device of claim 18 wherein said light emitting layer further comprises a plane and said electroluminescent material comprises molecules with transition moments responsible for electroluminescent light emission aligned parallel with said plane of the layer the light emitting layer.

20. The light emitting device of claim 11 wherein each of said layers has a thickness and said light emitting layer has a thickness that is 10% or less of the a total thickness that is a sum of each respective thickness of all the layers each respective layer comprising polymerized chiral nematic liquid crystal material combined.

* * * * *